United States Patent [19]

Abbas et al.

[11] 4,322,883
[45] Apr. 6, 1982

[54] SELF-ALIGNED METAL PROCESS FOR INTEGRATED INJECTION LOGIC INTEGRATED CIRCUITS

[75] Inventors: Shakir A. Abbas, Wappingers Falls; Ingrid E. Magdo, Hopewell Junction, both of N.Y.

[73] Assignee: International Business Machines Corporation, Armonk, N.Y.

[21] Appl. No.: 167,173

[22] Filed: Jul. 8, 1980

[51] Int. Cl.³ .................. H01L 21/223; H01L 21/302
[52] U.S. Cl. .................................. 29/578; 29/577 R; 29/580; 29/591; 148/174; 148/187; 148/188; 156/628; 156/643; 156/653; 156/657; 357/54; 357/59; 357/92
[58] Field of Search ................ 29/577, 578, 580, 591; 148/174, 175, 187, 188; 204/192 E; 156/643, 653, 657, 662, 628; 357/54, 59, 92

[56] References Cited

U.S. PATENT DOCUMENTS

| | | | |
|---|---|---|---|
| 3,643,235 | 2/1972 | Berger et al. | 357/37 X |
| 3,750,268 | 8/1973 | Wang | 29/571 |
| 3,823,353 | 7/1974 | Berger et al. | 357/92 X |
| 3,922,565 | 11/1975 | Berger et al. | 357/92 X |
| 3,984,822 | 10/1976 | Simko et al. | 357/23 X |
| 4,083,098 | 4/1978 | Nicholas | 29/578 |
| 4,103,415 | 8/1978 | Hayes | 29/578 X |
| 4,190,466 | 2/1980 | Bhattacharyya et al. | 29/578 X |
| 4,209,349 | 6/1980 | Ho et al. | 148/187 |
| 4,234,362 | 11/1980 | Riseman | 148/187 |
| 4,236,294 | 12/1980 | Anantha et al. | 29/578 |
| 4,256,514 | 3/1981 | Pogge | 156/643 X |

FOREIGN PATENT DOCUMENTS

2003660 3/1979 United Kingdom.

OTHER PUBLICATIONS

Yeh, T. H., "Self-Aligned Integrated . . . Structures" I.B.M. Tech. Discl. Bull., Vol. 22, No. 9, Feb. 1980, pp. 4047-4051.
Critchlow, D. L., "Highspeed MOSFET Circuits . . . Lithography", *Computer,* vol. 9, No. 2, Feb. 1976, pp. 31-37.
Pogge, H. B., "Narrow Line Widths Masking Method", I.B.M. Tech. Discl. Bull., vol. 19, No. 6, Nov. 1976, pp. 2057-2058.
Abbas et al., "Extending the Minimal Dimensions . . . Processing", I.B.M. Tech. Discl. Bull., vol. 20, No. 4, Sep. 1977, pp. 1376-1378.
Jackson et al., "Novel Submicron Fabrication Techique", *Semiconductor International,* Mar. 1980, pp. 77-83.

*Primary Examiner*—L. Dewayne Rutledge
*Assistant Examiner*—W. G. Saba
*Attorney, Agent, or Firm*—George O. Saile

[57] ABSTRACT

A self-aligned metal process is described which achieves self-aligned metal to silicon contacts and submicron contact-to-contact and metal-to-metal spacing in the Integrated Injection Logic (I²L) technology. The method involves providing a silicon body and then forming a first insulating layer on a major surface of the silicon body. The first insulating layer is removed in areas designated to contain integrated injection logic devices. A layer of highly doped polycrystalline silicon is formed thereover. The conductivity of the polycrystalline silicon is opposite to that of the silicon body. Openings are made in the polycrystalline silicon layer by reactive ion etching which results in the structure having substantially horizontal surfaces and substantially vertical surfaces. The openings are formed in areas designated to be the base of the lateral injector transistor of the integrated circuit. A second insulating layer is then formed on both the substantially horizontal surfaces and substantially vertical surfaces. Reactive ion etching of this second insulating layer substantially removes the horizontal layers and provides a narrow dimensioned dielectric pattern of regions on the major surface of the silicon body. The method continues using similar procedures to form the remaining elements of the I²L device structure.

13 Claims, 7 Drawing Figures

SELF-ALIGNED METAL PROCESS FOR INTEGRATED INJECTION LOGIC INTEGRATED CIRCUITS

DESCRIPTION

Technical Field

The invention relates to methods for manufacturing integrated injection logic (I²L) or merged transistor logic (MTL) integrated semiconductor devices and, more particularly, to a self-aligned metal process for making such devices which achieves self-aligned metal-to-silicon contacts and submicron contact-to-contact and metal-to-metal spacing wherein the insulation between the contacts is a pattern of dielectric material having a thickness dimension in the order of a micron or less.

CROSS REFERENCES TO RELATED PATENT APPLICATIONS (1) Patent application Ser. No. 167,253 filed like date entitled "Self-Aligned Metal Process for Field Effect Transistor Integrated Circuits" by S. A. Abbas and I. E. Magdo.

(2) Patent application Ser. No. 167,184 filed like date entitled "Self-Aligned Metal Process for Integrated Circuit Metallization" by G. R. Goth, I. E. Magdo, and S. D. Malaviya.

(3) Patent application Ser. No. 167,172 filed like date entitled "Self-Aligned Metal Process for Field Effect Transistor Integrated Circuits Using Polycrystalline Silicon Gate Electrodes" by C. G. Jambotkar.

BACKGROUND ART

Semiconductor integrated circuits have substantially increased in density in the past decade. However, there is an increasing demand for greater complexities, higher switching speeds and smaller devices for new applications, such as microprocessors and minicomputers. A very active area in the semiconductor fabrication technology has been the generation and application of fine lines in the lithographic technology. Light had been used almost exclusively until the recent past in the lithographic process. However, optical resolution limits make further advances in line widths much more difficult. The most important and versatile among the technologies for the future reduction in line widths are electron beam and X-ray exposure processes. The lithography problem and their possible solutions are discussed in greater detail by D. L. Critchlow in the publication entitled "High Speed MOSFET Circuits Using Advanced Lithography," published in the Computer, Vol. 9, No. 2, February 1976, pp. 31 through 37. In that publication the substantial equipment costs and complexities of X-ray and electron beam lithography are described.

There have been alternative efforts to obtain narrow line widths in the range of one micrometer or less by extending standard photolithography techniques and avoiding the need for the more expensive and complex techniques, such as electron beam or X-ray lithography. One such technique is descibed by H. B. Pogge in IBM Technical Disclosure Bulletin, November 1976, Vol. No. 6, entitled "Narrow Line Widths Masking Method." This method involves the use of a porous silicon followed by oxidation of porous silicon. Another technique is described by S. A. Abbas, et al., IBM Technical Disclosure Bulletin Vol. 20, No. 4, September 1977, pp. 1376 through 1378. This TDB describes the use of polycrystalline silicon masking layers which are made into masks by first using an intermediate mask of oxidation blocking material, such as silicon nitride in the formation of the polycrystalline silicon. Line dimensions below about two micrometers may be obtained by this technique. T. N. Jackson, et al., described "A Novel Submicron Fabrication Technique" in the March 1980 publication *Semiconductor International*, pp. 77 through 83, a method for producing submicron line widths and devices which do not require electron beam lithography but used a selective edge plating technique. The U.K. Pat. No. 2,003,660 published Mar. 14, 1979 describes a method for depositing an area of metal, for example metal on a substrate and forming narrow metal stripes thereby by using a unidirectional plasma etching technique. These above techniques do show ways of forming narrow lines on substrates but lack an overall solution for their successful use in the manufacture of semiconductor devices, because it is unclear how they will be used to contact actual device elements within the semiconductor substrate in an accurate and effective manner. Further, there are problems of planarity of the first level metallurgy and adequate conductivity of the metallurgy at that level. K. H. Nicholas, U.S. Pat. No. 4,083,098 describes a method of making a plurality of closely spaced, but air isolated, conductive layers on an insulated substrate. He suggests no ohmic connections to the silicon body under the insulator supporting his conductive layers.

The patent application of H. B. Pogge, Ser. No. 957,604 filed Nov. 3, 1978 now U.S. Pat. No. 4,256,514, entitled "Method for Forming a Narrow Dimensioned Region on A Body" and the patent application of J. Riseman Ser. No. 957,606 filed Nov. 3, 1978 now U.S. Pat. No. 4,234,362, entitled "Method for Forming An Insulator Between Layers of Conductive Material" describe a technique for forming narrow dimensioned, for example submicron, regions on a semiconductor body that involves forming on the silicon body regions having substantially horizontal surfaces and substantially vertical surfaces. A layer of the very narrow dimension is formed both on the substantially horizontal and substantially vertical surfaces. Reactive ion etching is applied to the layer to substantially remove the horizontal layer while leaving the vertical layer substantially intact. The vertical layer dimension is adjusted depending upon the original thickness of the layer applied. The patent applications more importantly describe techniques for using this narrowed dimensioned region in a semiconductor device fabrication process for various types of integrated circuit structures.

A major problem in very dense integrated circuits is the electrical contacts to the various elements and devices in the semiconductor integrated circuits. It is often necessary to have multilevels of metallurgy in the order of 2, 3, 4 or more levels of metallurgy to contact the large number of devices within the integrated circuits. These levels of metallurgy must be isolated from one another. This multilayer structure has the problems of planarity which can adversely affect the lithography process steps and result in defects in the structures through incomplete exposure of the lithographic layers. A further problem involves the conductivity of the metallurgy at the various levels. In recent times, solutions to these problems have taken the direction of the use of highly doped polycrystalline silicon as conductive layers such as shown in R. C. Wang, U.S. Pat. No. 3,750,268, issued Aug. 7, 1973 and R. T. Simko, et al., U.S. Pat. No. 3,984,822, issued Oct. 5, 1976. However, as the density of devices has increased, there still remains problems involving isolation between devices, conductivity particularly at the first level of metallurgy contacting the semiconductor devices, and alignment of the levels of metallurgy to the device elements in the semiconductor integrated circuit.

Circuits and structures utilizing integrated injection logic, sometimes abbreviated I$^2$L or referred to as merged transistor logic, abbreviated MTL, are well known in the integrated circuit arts. They may be understood in greater detail by reference to the Berger, et al. U.S. Pat. Nos. 3,643,235, 3,823,353 and 3,922,565. Such logic circuits or structures reduce a logic gate to a pair of merged complementary transistors in which a lateral PNP transistor is typically used as a current source for the base of an inverted NPN transistor. The NPN transistor, with a buried N type region as an emitter, will frequently have multiple collectors which may be used to drive other logic elements in a given circuit. I$^2$L circuits possess the inherent advantage of being compact because a logic gate is reduced to a single semiconductor device.

An object of this invention is to provide a greater density of I$^2$L circuits than ever thought to be possible.

SUMMARY OF THE PRESENT INVENTION

In accordance with the present invention, a self-aligned metal process is described which achieves self-aligned metal silicon contacts and micron-to-submicron contact-to-contact and metal-to-metal spacing by use of a pattern of dielectric material having a thickness of the order of a micron or less in the integrated injection logic technology. The process results in a substantially planar structure. The first level metallurgy can be any desired metal such as aluminum, aluminum-copper, polycrystalline silicon, or the like.

The method for forming integrated injection logic integrated circuits with this self-aligned metal structure involves providing a silicon body and then forming a first insulating layer on a major surface of the silicon body. The first insulating layer is removed in areas designated to contain integrated injection logic devices. A layer of highly doped polycrystalline silicon is formed thereover. The conductivity of the polycrystalline silicon is opposite to that of the silicon body. Openings are made in the polycrystalline silicon layer by reactive ion etching which results in the structure having substantially horizontal surfaces and substantially vertical surfaces. The openings are formed in areas designated to be the base of the lateral injector transistor of the integrated circuit. A second insulating layer is then formed on both the substantially horizontal surfaces and substantially vertical surfaces. Reactive ion etching of this second insulating layer substantially removes the horizontal layers and provides a narrow dimensioned dielectric pattern of regions on the major surface of the silicon body. The base of the lateral injector transistor is formed through the openings of the polycrystalline silicon layer. The structure is annealed to fully form the base of the transistor and to drive into the silicon body the opposite type impurities from the polycrystalline silicon layer to thereby form the base regions for the vertical transistors of the integrated injection logic integrated circuit. Additional openings are made in the polycrystalline silicon layer where the collector of the vertical transistor is to be formed. A third insulating layer is formed on the substantially horizontal and substantially vertical surfaces. Reactive ion etching is used to remove the horizontal third insulating layer so as to form a second pattern of narrow dimensioned regions. The collector is formed by either ion implantation or diffusion. The remaining polycrystalline silicon layer is then removed by etching to leave the narrow dimensioned regions on the major surface of the silicon body. A conductive layer is blanket deposited over the narrow dimensioned regions and areas in between where the conductive layer is formed upon bare silicon, ohmic contacts are formed thereto. A blanket layer of a plastic material, such as a photoresist or polyimide, over the conductive layer to planarize the surface is accomplished. The structure is then placed in a reactive ion etching ambient where the conductive layer is uniformly etched together with the plastic layer until the tops of the narrow dimensioned regions are reached. The remaining plastic material is then removed to thereby form the substantially planar conductive layer with narrow dimensioned dielectric isolation separating portions of the conductive layer from other portions of the conductive layer on the surface of the integrated injection logic integrated circuit. These conductive regions act as the contacts to elements of the integrated injection logic integrated circuit.

The method can be used to form a variety of integrated injection logic products. The conductive layer with the narrow dimensioned dielectric pattern acts to electrically isolate the various regions of the conductive layer and are formed according to the method described above. Logic and memory integrated injection logic integrated circuits may be formed according to the method to provide the beneficial results of high density with suitable conductivity of the metallurgy layers.

DISCLOSURE OF THE INVENTION

Figure 1:
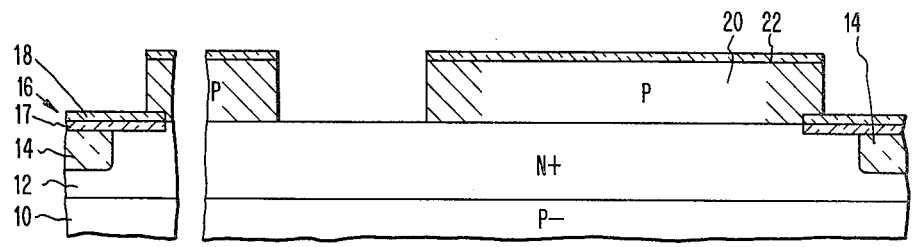
FIGS. 1 through 6 illustrate one method for forming the integrated injection logic device of the present invention.

Referring now more particularly to FIGS. 1 through 6 for a description of one method embodiment for manufacturing the integrated injection logic integrated circuit structures according to the present invention. The structure to be made in the FIGS. 1 through 6 is illustrated as a vertical NPN device with a PNP lateral transistor device. However, it would be obvious that the opposite type devices, that is an NPN lateral device and a PNP vertical transistor, can alternatively be formed by simply reversing the polarities of the various elements of the transistors and associated regions. FIG. 1 illustrates one, greatly enlarged portion, of a silicon body which will be used to form a very dense integrated injection logic device. A P− substrate of monocrystalline 10 has an epitaxial N+ layer 12 grown on top of the substrate. The substrate is typically a <100> crystallographic orientation silicon wafer having a resistance of the order of 1 to 20 ohm/cm. The epitaxial growth process to form the layer 12 may be by conventional techniques, such as the use of $SiCl_4/H_2$ or $SiH_4/H_2$ mixtures at temperatures about 1000° to 1200° C. The thickness of the epitaxial layer for the highly dense integrated circuits is of the order of three micrometers or less.

The next series of steps involves the formation of isolation means for isolating regions of monocrystalline silicon from other regions of monocrystalline. The isolation may be by backbiasing PN junctions, partial dielectric isolation or complete dielectric isolation. The dielectric materials used may be silicon dioxide, glass, etc. The preferred isolation for the highly dense integrated circuits of the present invention is dielectric isolation. FIG. 1 shows partial dielectric isolation with dielectric regions 14 isolating monocrystalline silicon regions of the silicon body 12 from one another. There are many ways in the art to form dielectric regions of this type. It is preferred to use the process described in the Magdo, et al., patent application, Ser. No. 150,609 filed June 7, 1971 or Peltzer U.S. Pat. No. 3,648,125. Alternatively, the process described in the J. A. Bondur, et al. U.S. Pat. No. 4,104,086 can be used. In that patent application and patents the processes for forming partial dielectric isolation for regions 14 are described in detail.

A first insulating layer 16 which may be a composite of thermally grown silicon dioxide 17 and chemically vapor deposited silicon nitride 18 is formed on the surface of the silicon body. This isolating layer may be alternatively one or a combination of the known insulating material, such as silicon dioxide, silicon nitride, aluminum trioxide, or the like, in addition to thermally grown silicon dioxide. The silicon dioxide layer 17 may be thermally grown in an oxygen or oxygen-water vapor ambient at a temperature of about 970° C. A second method for growing silicon dioxide involves the use of chemical vapor deposition wherein $SiH_4$, $O_2$ at about 450° C.; or $SiH_2Cl_2$, $N_2O$ at a temperature of about 800° C. under atmospheric or low pressure conditions. The deposition of silicon nitride is usually formed by chemical vapor deposition by using the following conditions: $SiH_4$, $NH_3$ and $N_2$ carrier gas at a temperature of about 800° C. under atmospheric or low pressure conditions as discussed in the V. Y. Doo U.S. Pat. No. 4,089,992.

Openings are formed in the first insulating layer 16 in the areas designated to contain the integrated injection logic devices of the integrated circuit under fabrication. FIG. 1 illustrates the presence of such opening in insulating layer 16. A coating 20 of P doped polycrystalline silicon is now deposited over the entire wafer by using, for example, a mixture of silane and diborane in a hydrogen ambient in a temperature range of 500° to 1000° C. Alternatively, the polycrystalline can be deposited and then doped by an ion implantation process. Other known P type dopants can alternatively be used. The operative thickness of the polycrystalline silicon is between about 8,000 to 15,000 Angstroms with 10,000 Angstroms preferred. Should the thickness be much greater than the metal thickness, non-planar topology would result. If the thickness is less than the metal thickness which is typically one micrometer, the surface non-planarity occurs. Also, the isolation of the metal lines is harder to achieve by either reactive ion etching or chemical etching. The preferred doping level is between about $5 \times 10^{18}$ to $5 \times 10^{19}$ atoms/cm$^3$.

A second insulating layer 22 is deposited over the polycrystalline silicon layer 20. This layer may be composed of chemical vapor deposited silicon dioxide, thermally grown silicon dioxide, chemical vapor deposited silicon nitride or the like or any combinations thereof. The thickness of the second insulating layer mask is typically 1,000 to 2,000 Angstroms. Standard photolithography and etching techniques are now utilized to form openings in the second insulating layer over the areas which are designated to be the base of the vertical NPN transistor and the injector, as shown in FIG. 1. The structure is placed in a reactive ion or plasma etching environment for a polycrystalline silicon having typically the conditions as follows: For example, $Cl_2$/Argon, $SF_6/Cl_2$ or $CCl_4$/Argon, RF parallel plate structure about 10 microns pressure, 0.16 watts/cm$^2$ power density and 10 cc/min. flow rate and using the apparatus described in Harvilchuck, et al., patent application Ser. No. 594,413, filed July 9, 1975, and continuation patent application Ser. No. 822,775, filed Aug. 8, 1977. The reactive ion etching process is completed when the monocrytalline silicon region is reached. The resulting structure is shown in FIG. 1.

Figure 2:
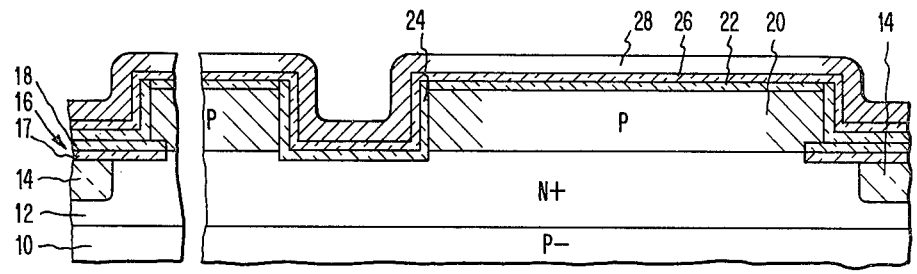
Figure 3:
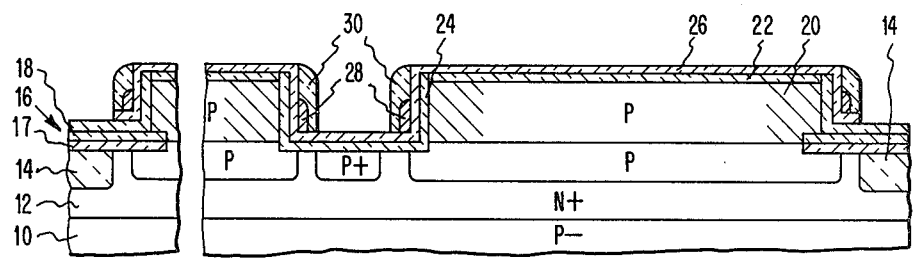
Figure 4:
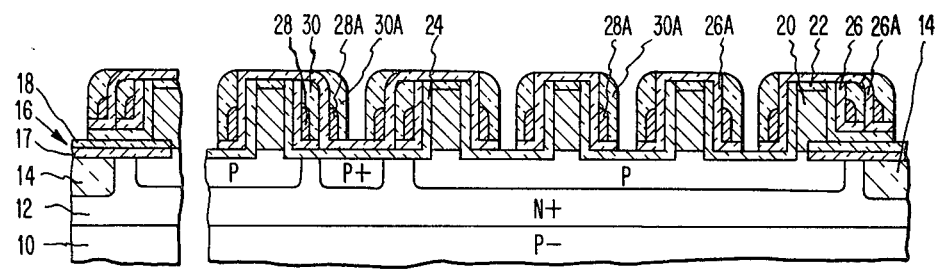

The structure is then subjected to a conventional thermal oxidation step to form silicon dioxide layer 24 on the exposed polycrystalline silicon layer and on the exposed monocrystalline silicon layer. A silicon nitride layer 26 is chemically vapor deposited by the conventional techniques as described above on top of the silicon nitride layer 22 and the silicon dioxide layer 24. A second polycrystalline silicon conformal layer 28 is deposited over the silicon dioxide and silicon nitride layers 24, 26. The result of this series of process steps is shown in FIG. 2.

The pattern of narrow dimensioned dielectric regions is now to be formed. The FIG. 2 structure is placed in a reactive ion etching ambient which is the same conditions as the first polycrystalline silicon etching process described above. The result of the reactive ion etching step is the removal of the polycrystalline silicon layer 28 from all horizontal surfaces while leaving the polycrystalline silicon layer 28 substantially in tact on the vertical surfaces. The polycrystalline silicon layer pattern is now subjected to a thermal oxidation ambient at the conventional temperatures to oxidize the surface of the polycrystalline silicon layer 28 to a silicon dioxide layer 30. The oxidation to silicon dioxide need not consume the whole polycrystalline silicon region as is illustrated in the resulting structure of FIG. 3.

As an alternative to the above described process for forming the pattern of narrow dimensioned dielectric regions, the conformal layer or coating deposited on the substantially horizontal surfaces and substantially vertical surfaces can be one of several insulating materials, such as silicon dioxide, silicon nitride, aluminum oxide, or combinations of these materials rather than the polycrystalline silicon. The oxidation step of the polycrystalline pattern of narrow dimensioned regions then would not be required in this alternative.

The thickness of the conformal layer 28 is chosen for device design purposes, such as the metal-to-metal conductor separation. The thickness of the conformal layer is between about 4,000 to 9,000 Angstroms and preferably about 7,000 Angstroms. The thickness may depend upon the particular layer used, for example, where polycrystalline silicon is the layer and it must have its surface ultimately oxidized, a thinner polycrystalline silicon layer is used than when insulator conformal coating is originally deposited. The silicon nitride layer 26 is removed by an etching step using either $CF_4/Cl_2$, reactive ion etching or hot phosphoric acid. The P+ injector of the lateral transistor is ion implanted using a high dose boron implant of about $1 \times 10^{15}$ to $1 \times 10^{16}/cm^2$ at an energy of about 100 KeV. The structure is annealed to fully form the base of the injector transistor and to drive into the silicon body 12 the opposite type impurities from the first polycrystalline silicon layer 20 and thereby forming the base regions for the vertical transistors of the injection logic integrated circuit device. This results in the FIG. 3 structure.

Figure 5:
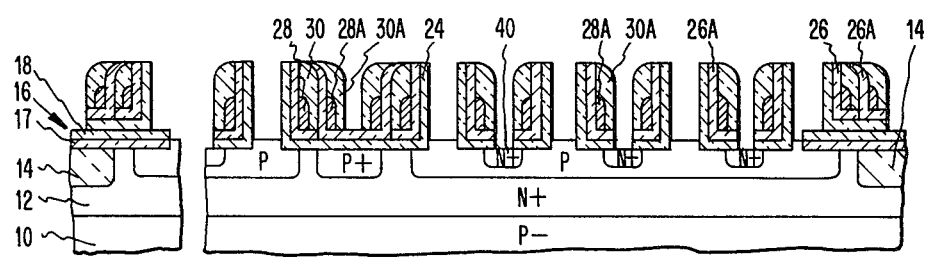

Additional openings are formed in the polycrystalline silicon layer 20 and areas designated to be the collector regions for the vertical transistors. The result of this etching step produces a structure having substantially horizontal surfaces and substantially vertical surfaces. A second set of narrow dimensioned dielectric regions or studs are formed in the same manner as the described with the first set of such pattern or studs. The initial pattern of narrow dielectric region will be formed the second time in which the initial pattern will become wider, as shown in FIG. 5. A layer 26A of silicon nitride is deposited over the structure in the same manner as was layer 26. Conformal layer 28A is deposited thereover as was layer 28. The additional narrow dimensioned regions are formed by reactive ion etching the conformal layer 28A from all horizontal surfaces while leaving the layer 28A substantially intact on the vertical surfaces. The remaining layer 28A is subjected to a thermal oxidation ambient to form silicon dioxide layer 30A and complete the additional narrow dimensioned regions shown in FIG. 5. The N+ collector regions are then either diffused or ion implanted through a screen oxide and driven in by an annealing step. The $SiO_2/Si_3N_4$ layer 16 is opened by reactive ion etching and a screen silicon dioxide about 250 Angstroms is grown. Arsenic is implanted at about 70 KeV energy and about $1 \times 10^{16}/cm^2$ dosage. The drive-in is performed at 900°–1,000° C. for about 60–120 minutes. The resulting N+ regions 40 are the collectors of the integrated circuit device. The remaining polycrystalline silicon layer 20 is removed by use of pyrocatechol etchant to produce the FIG. 5 structure. At this point, the FIG. 5 structure has only the pattern of narrow dimensioned dielectric regions remaining on the major surface of the silicon body. These regions are in this embodiment composed of a silicon dioxide, silicon nitride, and an inner core of the remaining second layer of polycrystalline silicon. The dimensions of these regions are typically in the range of about 0.4 to 0.8 microns in width and about 0.8 to 1.2 microns in height.

Figure 6:
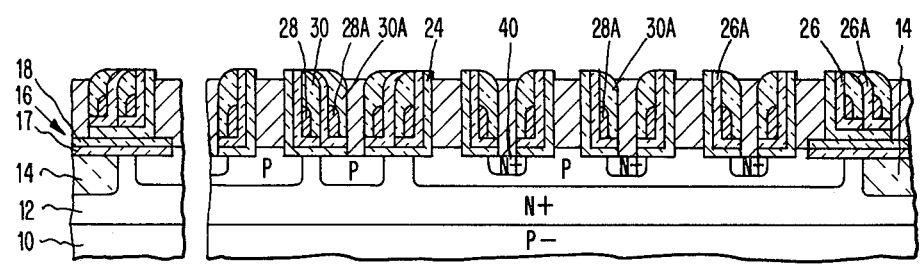
Figure 7:
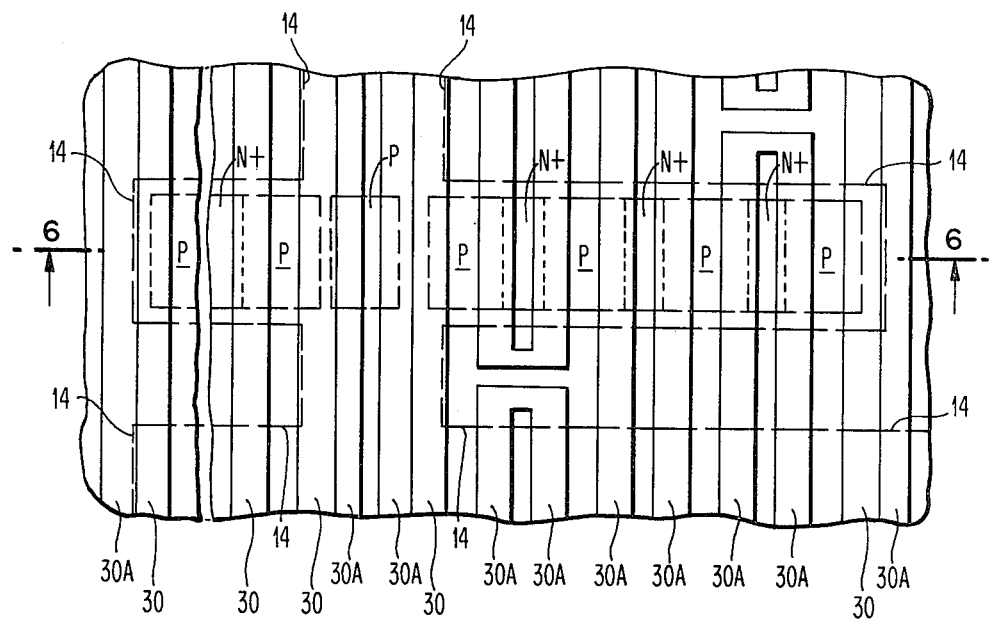
FIG. 7 shows the top view of the integrated injection logic device made by the FIGS. 1 through 6 method.

A contact metal such as palladium, platinum, titanium, or the like, may be deposited, sintered and etched under the following conditions. First, the contact metal is sintered to form a metal silicide. Then the unreacted metal is removed in aqua regia, or the like. The resulting contact is a thin metal silicide structure on the surface of each of these silicon contact regions (not shown). A blanket metal deposition of a metal such as aluminum, aluminum-copper, or the like, is deposited over the major surface which contains openings to the integrated circuit elements of the silicon body and the pattern of dielectric regions. If no metal silicide is used, the blanket metal would make ohmic contact directly to the silicon elements of the integrated circuit structure. The result of this deposition is a non-planar surface with hills of the metal above the pattern of dielectric regions. The surface of the structure is planarized by a blanket deposition of a plastic material over the metal layer. This plastic material can be typically a photoresist or a polyimide material, or the like. The plastic material is deposited by spinning on the desired thickness. After the curing or hardening procedure, the structure is planarized in reactive ion etching using $O_2$ as etchant. The planarized structure is placed in a reactive ion etching ambient. The viscous material is etched back leaving a layer of 2,000 to 5,000 Angstroms thickness over the major horizontal surface, and leaving the metal protruding over the viscous material. Chemical etch is then used to remove the metal peaks down to the narrow dimensioned dielectric regions. The remaining plastic is then removed by oxygen ashing, or the like. Alternatively, the reactive ion etching can be used to uniformly etch the plastic and the metal layer until the tops of the narrow dimensioned dielectric regions are reached. The remaining plastic material is removed by, for example, oxygen ashing, or other suitable processes. The result of the process is the substantially planar structure of FIGS. 6 and 7. FIG. 6 is a cross-sectional view taken along 6:6 of the top view of the integrated injection device structure of FIG. 7. The elements of the circuit are identified by e, b and c, respectively in these emitter, base, collector drawings.

While the invention has been particularly shown and described with reference to the preferred embodiments thereof, it will be understood by those skilled in the art that various changes in the form and details may be made therein without departing from the spirit and scope of the invention.

We claim:
1. A method for forming an integrated injection logic integrated circuit having a pattern of narrow dimensioned dielectric regions on a monocrystalline silicon body comprising:

providing said silicon body;

forming a first insulating layer on a major surface of said body;

removing said first insulating layer in areas designated to contain integrated injection logic devices of said integrated circuits;

forming over said major surface a highly doped polycrystalline silicon layer of conductivity type opposite to that of said body;

forming openings in said polycrystalline silicon layer by reactive ion etching in the areas designated as the base of the lateral injector transistor of said integrated circuit which results in the structure having substantially horizontal surfaces and substantially vertical surfaces;

forming a second insulating layer on both said substantially horizontal surfaces and said substantially vertical surfaces;

reactive ion etching said second insulating layer to substantially remove the said second insulating layer from said horizontal surfaces and to provide said narrow dimensioned dielectric regions on said silicon body in said areas designated the base of the lateral injector transistor;

forming said base of the lateral injector transistor;

annealing the structure to fully form the said base of the said injector transistor, and to drive into the said body the opposite type impurities from said polycrystalline silicon layer and thereby forming the base regions for the vertical transistors of said integrated injection logic integrated circuit;

forming additional openings in said polycrystalline silicon layer in areas designated as collector regions for said vertical transistors which results in the structure having substantially horizontal surfaces and substantially vertical surfaces;

forming a third insulating layer on both said substantially horizontal surfaces and said substantially vertical surfaces;

reactive ion etching said third insulating layer to substantially remove said third insulating layer from said horizontal surfaces and to provide additional said narrow dimensioned dielectric regions on said silicon bodies in said areas designated as collector regions for said vertical transistors;

forming said collector regions of said vertical transistors;

removing the remaining said polycrystalline silicon layer by etching to leave said pattern of narrow dimensioned on the said major surface; and forming a conductive layer on said major surface of said body which has portions thereof electrically separated by said narrow dielectric regions for contacting in self-alignment the said base of the lateral transistor, said base and collector regions of said vertical transistor, and said silicon body.

2. The method of claim 1 wherein said areas designated to contain integrated injection logic devices are bounded by dielectic regions extending into said silicon body from said major surface.

3. The method of claim 2 wherein certain of said narrow dimensioned regions bridge across the width of said base regions.

4. The method of claim 2 wherein said dielectric regions are composed of silicon dioxide.

5. The method of claim 1 wherein said first insulating layer is composed of a layer of silicon dioxide with a layer of silicon nitride thereover.

6. The method of claim 1 wherein said narrow dimensioned regions are protected from additional processing by a masking layer before the deposition of the third insulating layer and succeeding steps used to form said additional narrow dimensioned regions, and removing said masking layer after the formation of said additional narrow dimensioned regions.

7. The method of claim 1 wherein said narow dimensioned regions are wider than said additional narrow dimensioned regions by the thickness of said third insulating region.

8. The method of claim 1 wherein said forming of said base of the lateral transistors and said forming a collector regions of said vertical transistors are accomplished by ion implantation through an insulator layer screen.

9. The method of claim 1 wherein said vertical transistors are NPN and said lateral transistors are PNP.

10. The method of claim 1 wherein said second and third insulating layers are composed of silicon dioxide.

11. The method of claim 1 wherein said second and third insulating layers are each composed of polycrystalline silicon on top of a silicon nitride layer and subsequent to the respective said reactive ion etching of each of said insulating layers the said narrow dimensioned regions and additional narrow dimensioned regions are thermally oxidized to convert each of them to a composite structure of silicon dioxide, silicon nitride and polycrystalline silicon.

12. The method of claim 1 wherein the said forming a conductive layer includes depositing a blanket layer of aluminum over said narrow dimensioned regions and areas in between blanket, depositing a plastic material over the said aluminum layer to planarize the surface, reactive ion etching the said plastic material and said aluminum layer until the tops of said narrow dimensioned regions are reached and removing the remaining said plastic material.

13. The method of claim 12 wherein said plastic material is a polyimide and the said plastic material is removed by oxygen ashing.

* * * * *